(12) United States Patent
Hamada (10) Patent No.: US 7,512,456 B2
(45) Date of Patent: Mar. 31, 2009

(54) SUBSTRATE PROCESSING APPARATUS

(75) Inventor: Tetsuya Hamada, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 441 days.

(21) Appl. No.: 11/294,268

(22) Filed: Dec. 5, 2005

(65) Prior Publication Data

US 2006/0120716 A1  Jun. 8, 2006

(30) Foreign Application Priority Data

Dec. 6, 2004  (JP) ............................. 2004-353045

(51) Int. Cl.
*G03D 5/00* (2006.01)
(52) U.S. Cl. .................... 700/114; 700/110; 396/11
(58) Field of Classification Search .................... 700/95, 700/96, 108–110, 117, 144; 438/14; 355/53; 134/56 R, 18; 156/719; 396/11
See application file for complete search history.

(56) References Cited

U.S. PATENT DOCUMENTS

| | | | |
|---|---|---|---|
| 6,022,672 A | | 2/2000 | Ikeda |
| 6,790,287 B2 * | | 9/2004 | Shiga et al. .................. 118/719 |
| 7,047,100 B2 * | | 5/2006 | Kitamoto et al. ............. 700/121 |
| 2003/0164181 A1 * | | 9/2003 | Ohtani ......................... 134/62 |
| 2004/0002784 A1 * | | 1/2004 | Yoshida et al. ............... 700/108 |

FOREIGN PATENT DOCUMENTS

| | | |
|---|---|---|
| JP | 7-142356 | 6/1995 |
| JP | 2004-342654 | 12/2004 |

* cited by examiner

*Primary Examiner*—Kidest Bahta
(74) *Attorney, Agent, or Firm*—Ostrolenk, Faber, Gerb & Soffen, LLP (57) ABSTRACT

When a first substrate transferred outwardly from an indexer cell is the last substrate prior to reticle change in an exposure apparatus, the outward transfer of a second substrate to be processed subsequently to the first substrate from the indexer cell is temporarily stopped. After a lapse of time corresponding to reticle replacement time, the outward substrate transfer is restarted, and the second substrate is transferred outwardly from the indexer cell. For the exposure apparatus, the second substrate subjected to a resist coating process is received at the instant when the reticle replacement is completed after the completion of the exposure process of the first substrate. This provides a constant time interval between the completion of the resist coating process of substrates and the execution of the exposure process thereof without the decrease in processing efficiency. As a result, a uniform processing history for the substrates is achieved to further improve the line width uniformity of a pattern.

3 Claims, 7 Drawing Sheets

FIG. 7

SUBSTRATE PROCESSING APPARATUS

BACKGROUND OF THE INVENTION

1. Field of the Invention

The present invention relates to a substrate processing apparatus for transporting a substrate, such as a semiconductor substrate, a glass substrate for a liquid crystal display device, a glass substrate for a photomask, a substrate for an optical disk and the like, with a resist film formed thereon by coating the substrate with a resist into an exposure apparatus, and for performing a development process on an exposed substrate received from the exposure apparatus.

2. Description of the Background Art

As is well known, semiconductor and liquid crystal display products and the like are fabricated by performing a series of processes including cleaning, resist coating, exposure, development, etching, interlayer insulation film formation, heat treatment, dicing and the like on the above-mentioned substrate. An apparatus which performs a resist coating process on a substrate to transfer the substrate to an exposure apparatus and which receives an exposed substrate from the exposure apparatus to perform a development process on the substrate, among the above-mentioned processes, is widely used as a so-called coater-and-developer.

The exposure apparatus (also known as a stepper) for performing an exposure process is typically provided in juxtaposition with the above-mentioned coater-and-developer, and prints a circuit pattern on a substrate formed with a resist film. With recent decrease in width of lines exposed to light, a lamp for use in printing of a pattern in such an exposure apparatus is shifting from a conventional ultraviolet light source toward a KrF excimer laser light source and also toward an ArF excimer laser light source. A chemically amplified resist is used when a pattern is printed using a KrF light source and an ArF light source. The chemically amplified resist is a photoresist of the type such that an acid formed by a photochemical reaction during the exposure process acts as a catalyst for resist reactions such as crosslinking, polymerization and the like in the subsequent heat treatment step to change the solubility of the resist in a developing solution, whereby pattern printing is completed.

When the chemically amplified resist is used, a slight variation in processing conditions exerts a large influence upon line width uniformity because an extremely small amount of acid catalyst is formed during the exposure process. In particular, it is known that the time interval between the instant of the end of the exposure process and the instant of the start of a post-exposure bake process exerts the greatest influence on the line width uniformity. Thus, a technique for controlling the time interval between the end of the exposure process and the start of the post-exposure bake process to be constant is proposed, for example, in Japanese Patent Application Laid-Open No. 7-142356 (1995). Such a technique can improve the line width uniformity when the chemically amplified resist is used.

Unfortunately, some variations in line width occur even if the time interval between the end of the exposure process and the start of the post-exposure bake process is made constant. It is contemplated that an important factor other than the time interval between the end of the exposure process and the start of the post-exposure bake process is the time interval between the instant at which the resist coating process is completed and the instant at which the exposure process is executed. However, no particular consideration has conventionally been given to controlling this time interval.

In particular, the replacement of a current exposure pattern for printing with another involves a reticle change in the exposure apparatus, which in turn requires about two minutes. Thus, a substrate subjected to the resist coating process and formed with a resist film must be in a standby condition during the reticle change before the exposure process. This standby time interval has been a significant factor that causes a variation between substrates in the time interval between the completion of the resist coating process and the exposure process.

Requirements for the reduction in line width in semiconductor devices are becoming increasingly stringent. It is, therefore, highly desirable to reduce any slight variations in line width to a minimum.

SUMMARY OF THE INVENTION

The present invention is intended for a substrate processing apparatus for transporting a substrate with a resist film formed thereon by coating the substrate with a resist into an exposure apparatus and for performing a development process on an exposed substrate received from the exposure apparatus.

According to the present invention, the substrate processing apparatus comprises: a coating processing part for performing a resist coating process on a substrate; a development processing part for performing a development process on an exposed substrate; an interface part for receiving a substrate with a resist film formed thereon by the resist coating process from the coating processing part to transfer the substrate to an exposure apparatus, and for receiving an exposed substrate from the exposure apparatus to transfer the exposed substrate to the development processing part; an indexer part for transferring an unprocessed substrate received from the outside of the substrate processing apparatus outwardly therefrom to the coating processing part, and for transporting a processed substrate received from the development processing part to the outside of the substrate processing apparatus; a transport part for transporting a substrate between the coating processing part, the development processing part, the interface part and the indexer part; and a control part for controlling the transport part to provide a constant time interval between the completion of the resist coating process of substrates in the coating processing part and the execution of an exposure process of the substrates in the exposure apparatus.

The substrate processing apparatus provides the constant time interval between the completion of the resist coating process of substrates in the coating processing part and the execution of the exposure process of the substrates in the exposure apparatus. This provides a uniform processing history for the substrates, thereby further improving the line width uniformity of a pattern.

It is therefore an object of the present invention to provide a substrate processing apparatus capable of improving the line width uniformity of a pattern.

These and other objects, features, aspects and advantages of the present invention will become more apparent from the following detailed description of the present invention when taken in conjunction with the accompanying drawings.

DESCRIPTION OF THE PREFERRED EMBODIMENT

A preferred embodiment according to the present invention will now be described in detail with reference to the drawings.

Figure 1:
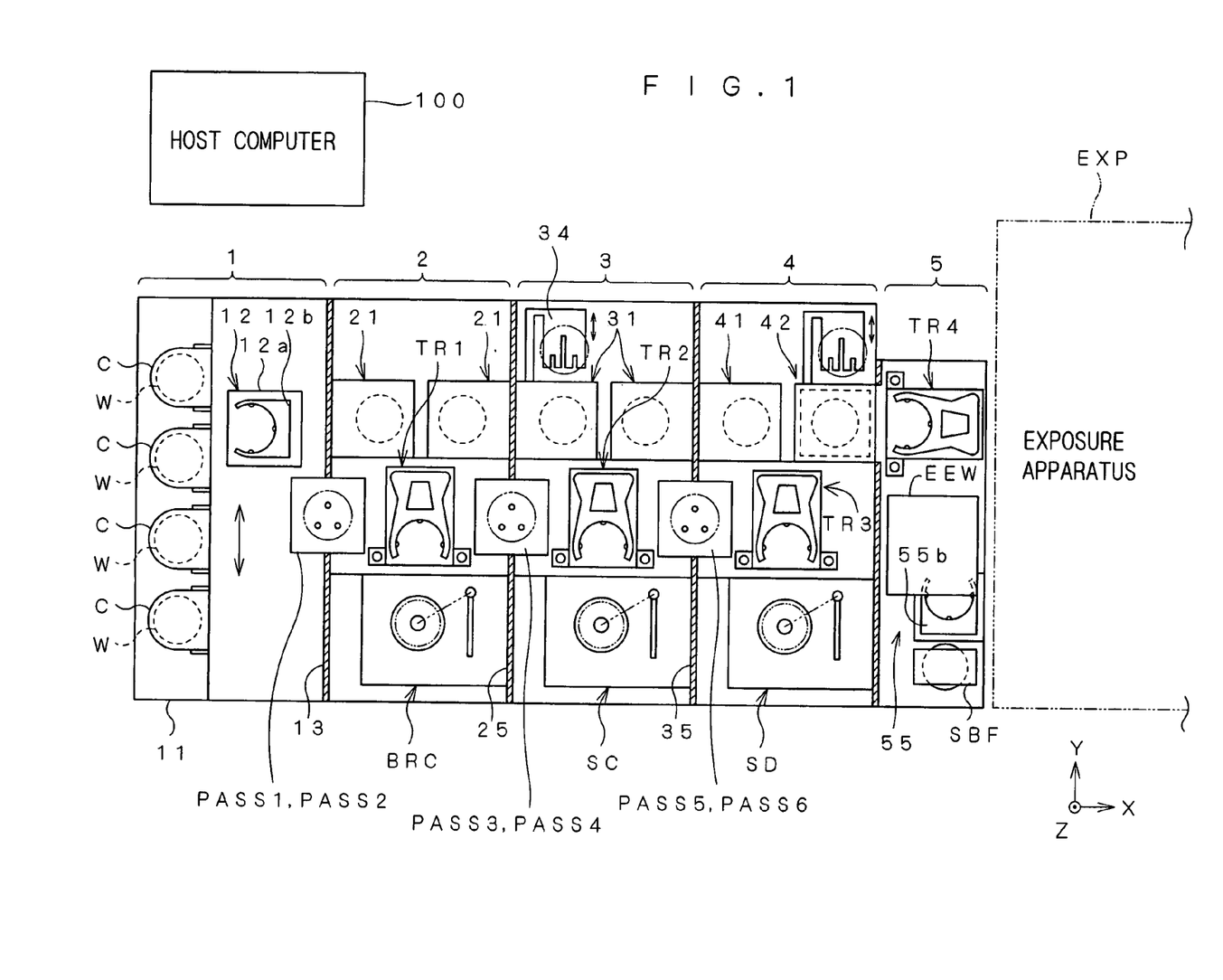
FIG. 1 is a plan view of a substrate processing apparatus according to a preferred embodiment of the present invention.
Figure 2:
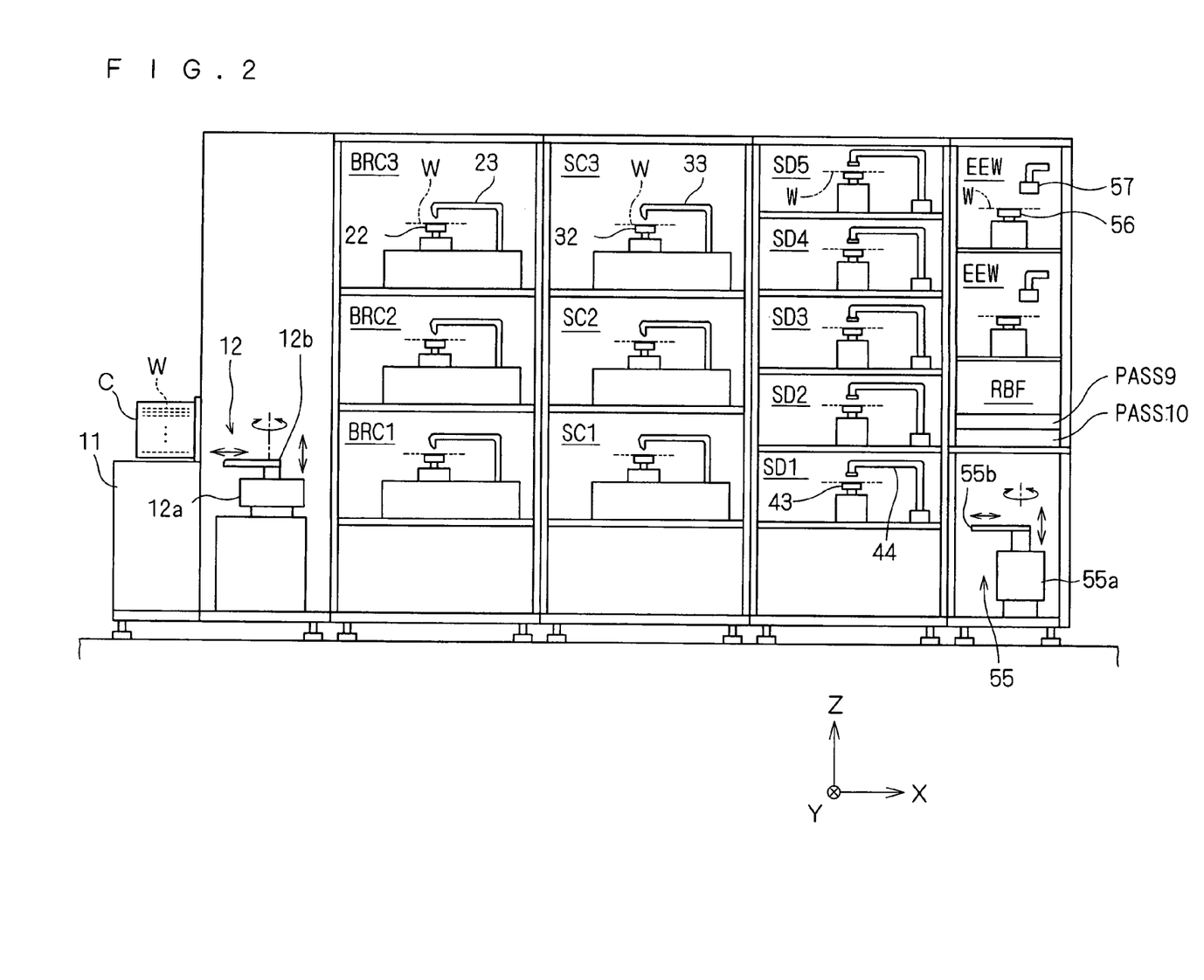
FIG. 2 is a front view of a liquid processing part in the substrate processing apparatus of FIG. 1.
Figure 3:
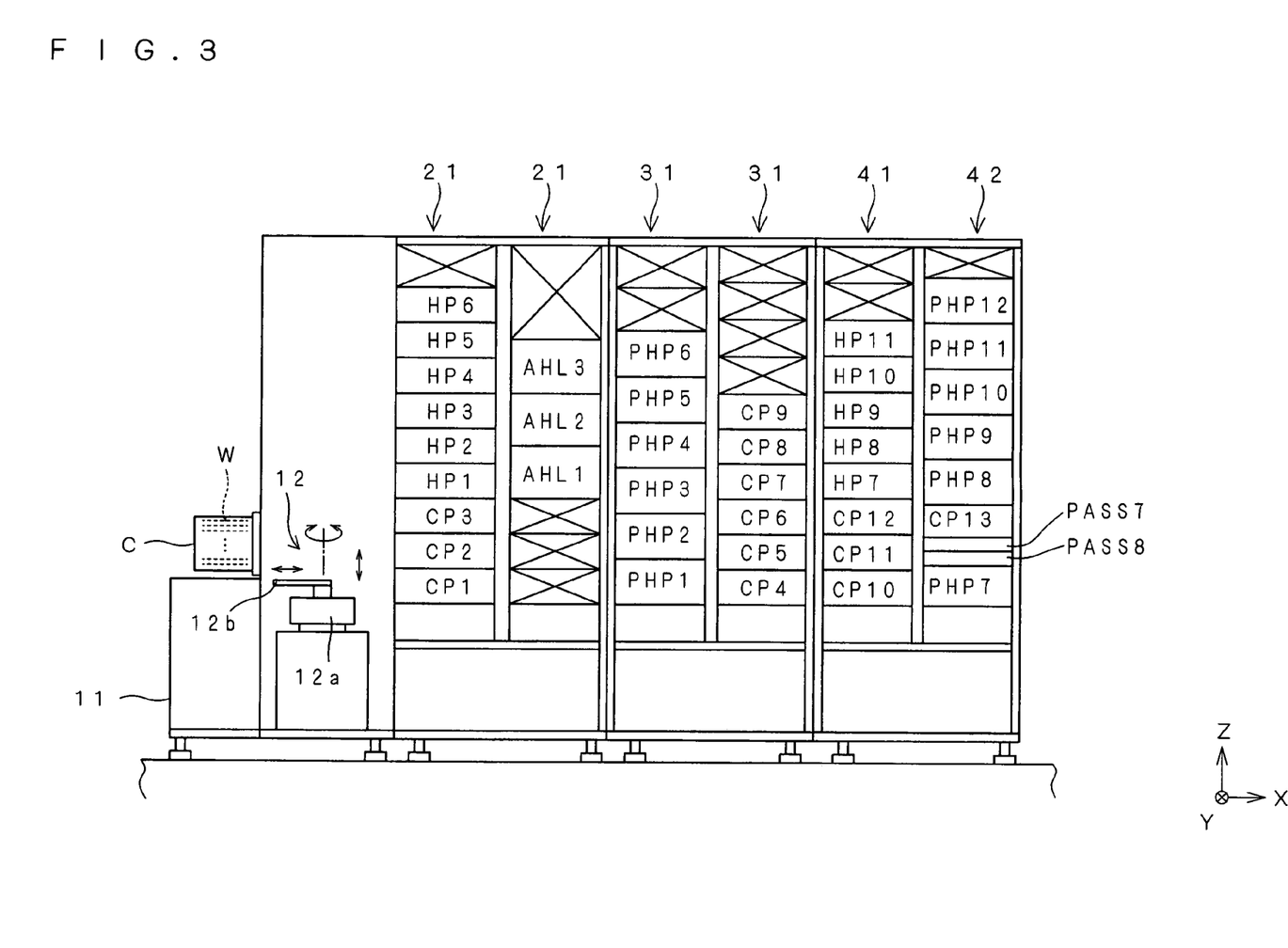
FIG. 3 is a front view of a thermal processing part in the substrate processing apparatus of FIG. 1.
Figure 4:
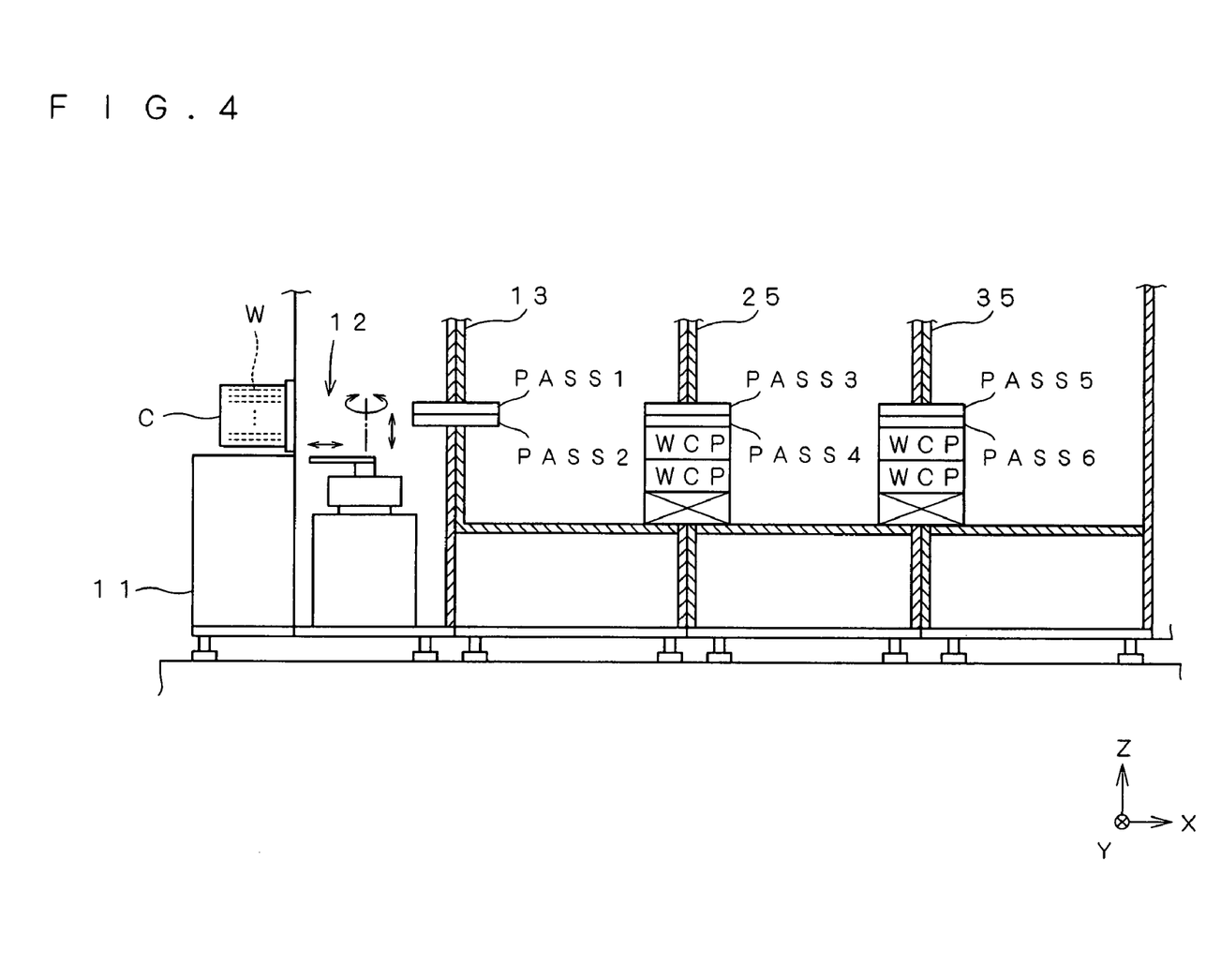
FIG. 4 is a view showing a construction around substrate rest parts in the substrate processing apparatus of FIG. 1.

FIG. 1 is a plan view of a substrate processing apparatus according to the preferred embodiment of the present invention. FIG. 2 is a front view of a liquid processing part in the substrate processing apparatus. FIG. 3 is a front view of a thermal processing part in the substrate processing apparatus. FIG. 4 is a view showing a construction around substrate rest parts in the substrate processing apparatus. An XYZ rectangular coordinate system in which an XY plane is defined as the horizontal plane and a Z axis is defined to extend in the vertical direction is additionally shown in FIGS. 1 through 4 for purposes of clarifying the directional relationship therebetween.

The substrate processing apparatus according to the preferred embodiment is an apparatus for forming an anti-reflective film and a photoresist film on substrates such as semiconductor wafers by coating and for performing a development process on substrates subjected to a pattern exposure process. The substrates to be processed by the substrate processing apparatus according to the present invention are not limited to semiconductor wafers, but may include glass substrates for a liquid crystal display device, and the like.

The substrate processing apparatus according to the preferred embodiment comprises an indexer block 1, a BARC (Bottom Anti-Reflective Coating) block 2, a resist coating block 3, a development processing block 4, and an interface block 5. In the substrate processing apparatus, the five processing blocks 1 to 5 are arranged in side-by-side relation. An exposure apparatus (or stepper) EXP which is an external apparatus separate from the substrate processing apparatus according to the present invention is provided and connected to the interface block 5. The substrate processing apparatus according to this preferred embodiment and the exposure apparatus EXP are connected via LAN lines to a host computer 100.

The indexer block 1 is a processing block for transferring unprocessed substrates received from the outside of the substrate processing apparatus outwardly to the BARC block 2 and the resist coating block 3, and for transporting processed substrates received from the development processing block 4 outwardly to the outside of the substrate processing apparatus. The indexer block 1 comprises a table 11 for placing thereon a plurality of (in this preferred embodiment, four) cassettes (or carriers) C in juxtaposition, and a substrate transfer mechanism 12 for taking an unprocessed substrate W out of each of the cassettes C and for storing a processed substrate W into each of the cassettes C. The substrate transfer mechanism 12 includes a movable base 12a movable horizontally (in the Y direction) along the table 11, and a holding arm 12b mounted on the movable base 12a and for holding a substrate W in a horizontal position. The holding arm 12b is capable of moving vertically (in the Z direction) over the movable base 12a, pivoting within a horizontal plane and moving back and forth in the direction of the pivot radius. Thus, the substrate transfer mechanism 12 can cause the holding arm 12b to gain access to each of the cassettes C, thereby taking an unprocessed substrate W out of each cassette C and storing a processed substrate W into each cassette C. The cassettes C may be of the following types: an SMIF (standard mechanical interface) pod, and an OC (open cassette) which exposes stored substrates W to the atmosphere, in addition to a FOUP (front opening unified pod) which stores substrates W in an enclosed or sealed space.

The BARC block 2 is provided in adjacent relation to the indexer block 1. A partition 13 for closing off the communication of atmosphere is provided between the indexer block 1 and the BARC block 2. The partition 13 is provided with a pair of vertically arranged substrate rest parts PASS1 and PASS2 each for placing a substrate W thereon for the transfer of the substrate W between the indexer block 1 and the BARC block 2.

The upper substrate rest part PASS1 is used for the transport of a substrate W from the indexer block 1 to the BARC block 2. The substrate rest part PASS1 includes three support pins. The substrate transfer mechanism 12 of the indexer block 1 places an unprocessed substrate W taken out of one of the cassettes C onto the three support pins of the substrate rest part PASS1. A transport robot TR1 of the BARC block 2 to be described later receives the substrate W placed on the substrate rest part PASS1. The lower substrate rest part PASS2, on the other hand, is used for the transport of a substrate W from the BARC block 2 to the indexer block 1. The substrate rest part PASS2 also includes three support pins. The transport robot TR1 of the BARC block 2 places a processed substrate W onto the three support pins of the substrate rest part PASS2. The substrate transfer mechanism 12 receives the substrate W placed on the substrate rest part PASS2 and stores the substrate W into one of the cassettes C. Pairs of substrate rest parts PASS3 to PASS10 to be described later are similar in construction to the pair of substrate rest parts PASS1 and PASS2.

The substrate rest parts PASS1 and PASS2 extend through the partition 13. Each of the substrate rest parts PASS1 and PASS2 includes an optical sensor (not shown) for detecting the presence or absence of a substrate W thereon. Based on a detection signal from each of the sensors, a judgment is made as to whether or not the substrate transfer mechanism 12 and the transport robot TR1 of the BARC block 2 stand ready to transfer and receive a substrate W to and from the substrate rest parts PASS1 and PASS2.

Next, the BARC block 2 will be described. The BARC block 2 is a processing block for forming an anti-reflective film by coating at the bottom of a photoresist film (i.e., as an undercoating film for the photoresist film) to reduce standing waves or halation occurring during exposure. The BARC block 2 comprises a bottom coating processor BRC for coating the surface of a substrate W with the anti-reflective film, a pair of thermal processing towers 21 for performing a thermal process which accompanies the formation of the anti-reflective film by coating, and the transport robot TR1 for transferring and receiving a substrate W to and from the bottom coating processor BRC and the pair of thermal processing towers 21.

In the BARC block 2, the bottom coating processor BRC and the pair of thermal processing towers 21 are arranged on opposite sides of the transport robot TR1. Specifically, the bottom coating processor BRC is on the front side of the substrate processing apparatus, and the pair of thermal processing towers 21 are on the rear side thereof. Additionally, a thermal barrier not shown is provided on the front side of the pair of thermal processing towers 21. Thus, the thermal effect of the pair of thermal processing towers 21 upon the bottom coating processor BRC is avoided by spacing the bottom coating processor BRC apart from the pair of thermal processing towers 21 and by providing the thermal barrier.

As shown in FIG. 2, the bottom coating processor BRC includes three coating processing units BRC1, BRC2 and BRC3 similar in construction to each other and arranged in stacked relation in bottom-to-top order. The three coating processing units BRC1, BRC2 and BRC3 are collectively referred to as the bottom coating processor BRC, unless otherwise identified. Each of the coating processing units BRC1, BRC2 and BRC3 includes a spin chuck 22 for rotating a substrate W in a substantially horizontal plane while holding the substrate W in a substantially horizontal position under suction, a coating nozzle 23 for applying a coating solution for the anti-reflective film onto the substrate W held on the spin chuck 22, a spin motor (not shown) for rotatably driving the spin chuck 22, a cup (not shown) surrounding the substrate W held on the spin chuck 22, and the like.

As shown in FIG. 3, one of the thermal processing towers 21 which is closer to the indexer block 1 includes six hot plates HP1 to HP6 for heating a substrate W up to a predetermined temperature, and cool plates CP1 to CP3 for cooling a heated substrate W down to a predetermined temperature and maintaining the substrate W at the predetermined temperature. The cool plates CP1 to CP3 and the hot plates HP1 to HP6 are arranged in stacked relation in bottom-to-top order in this thermal processing tower 21. The other of the thermal processing towers 21 which is farther from the indexer block 1 includes three adhesion promotion processing units AHL1 to AHL3 arranged in stacked relation in bottom-to-top order for thermally processing a substrate W in a vapor atmosphere of HMDS (hexamethyl disilazane) to promote the adhesion of the resist film to the substrate W. The locations indicated by the cross marks (x) in FIG. 3 are occupied by a piping and wiring section or reserved as empty space for future addition of processing units.

Thus, stacking the coating processing units BRC1 to BRC3 and the thermal processing units (the hot plates HP1 to HP6, the cool plates CP1 to CP3, and the adhesion promotion processing units AHL1 to AHL3 in the BARC block 2) in tiers provides smaller space occupied by the substrate processing apparatus to reduce the footprint thereof. The side-by-side arrangement of the pair of thermal processing towers 21 is advantageous in facilitating the maintenance of the thermal processing units and in eliminating the need for extension of ducting and power supply equipment necessary for the thermal processing units to a much higher position.

Figure 5A:
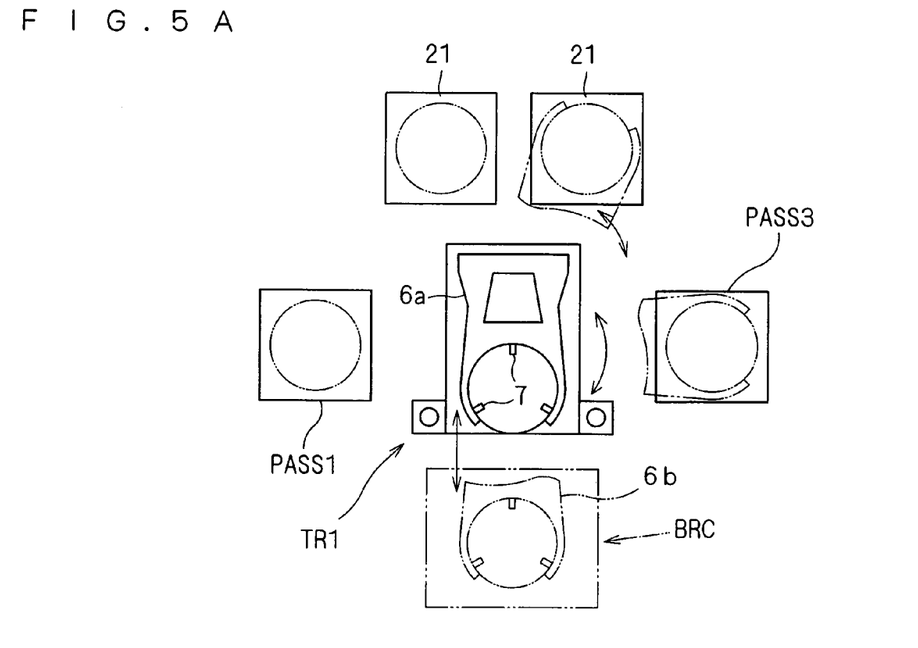
FIG. 5A is a plan view of a transport robot.
Figure 5B:
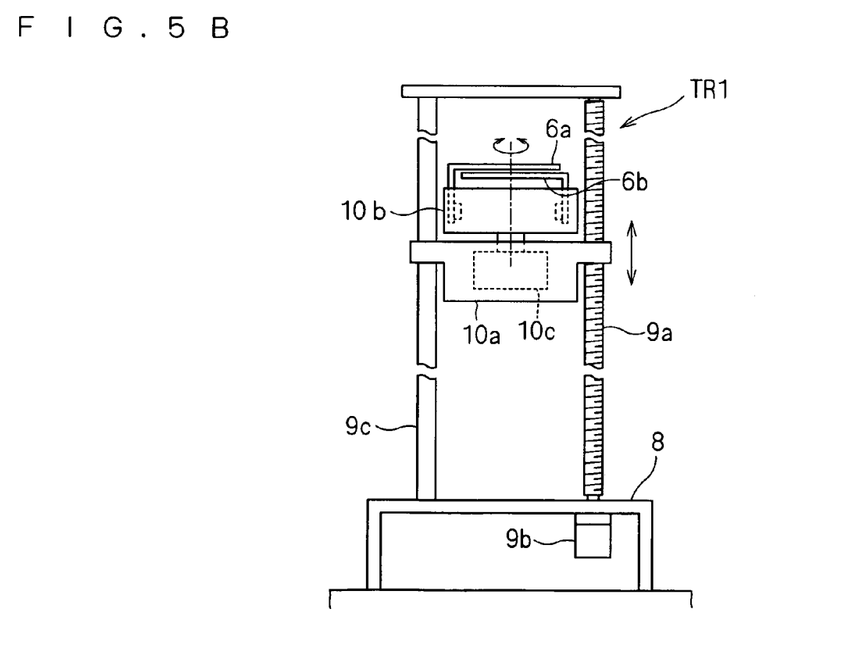
FIG. 5B is a front view of the transport robot.

FIGS. 5A and 5B are views for illustrating the transport robot TR1. FIG. 5A is a plan view of the transport robot TR1, and FIG. 5B is a front view of the transport robot TR1. The transport robot TR1 includes a pair of (upper and lower) holding arms 6a and 6b in proximity to each other for holding a substrate W in a substantially horizontal position. Each of the holding arms 6a and 6b includes a distal end portion of a substantially C-shaped plan configuration, and a plurality of pins 7 projecting inwardly from the inside of the substantially C-shaped distal end portion for supporting the peripheral edge of a substrate W from below.

The transport robot TR1 further includes a base 8 fixedly mounted on an apparatus base (or an apparatus frame). A guide shaft 9c is mounted upright on the base 8, and a threaded shaft 9a is rotatably mounted and supported upright on the base 8. A motor 9b for rotatably driving the threaded shaft 9a is fixedly mounted to the base 8. A lift 10a is in threaded engagement with the threaded shaft 9a, and is freely slidable relative to the guide shaft 9c. With such an arrangement, the motor 9b rotatably drives the threaded shaft 9a, whereby the lift 10a is guided by the guide shaft 9c to move up and down in a vertical direction (in the Z direction).

An arm base 10b is mounted on the lift 10a pivotably about a vertical axis. The lift 10a contains a motor 10c for pivotably driving the arm base 10b. The pair of (upper and lower) holding arms 6a and 6b described above are provided on the arm base 10b. Each of the holding arms 6a and 6b is independently movable back and forth in a horizontal direction (in the direction of the pivot radius of the arm base 10b) by a sliding drive mechanism (not shown) mounted to the arm base 10b.

With such an arrangement, the transport robot TR1 is capable of causing each of the pair of holding arms 6a and 6b to independently gain access to the substrate rest parts PASS1 and PASS2, the thermal processing units provided in the thermal processing towers 21, the coating processing units provided in the bottom coating processor BRC, and the substrate rest parts PASS3 and PASS4 to be described later, thereby transferring and receiving substrates W to and from the above-mentioned parts and units, as shown in FIG. 5A.

Next, the resist coating block 3 will be described. The resist coating block 3 is provided so as to be sandwiched between the BARC block 2 and the development processing block 4. A partition 25 for closing off the communication of atmosphere is also provided between the resist coating block 3 and the BARC block 2. The partition 25 is provided with the pair of vertically arranged substrate rest parts PASS3 and PASS4 each for placing a substrate W thereon for the transfer of a substrate W between the BARC block 2 and the resist coating block 3. The substrate rest parts PASS3 and PASS4 are similar in construction to the above-mentioned substrate rest parts PASS1 and PASS2.

The upper substrate rest part PASS3 is used for the transport of a substrate W from the BARC block 2 to the resist coating block 3. Specifically, a transport robot TR2 of the resist coating block 3 receives the substrate W placed on the substrate rest part PASS3 by the transport robot TR1 of the BARC block 2. The lower substrate rest part PASS4, on the other hand, is used for the transport of a substrate W from the resist coating block 3 to the BARC block 2. Specifically, the transport robot TR1 of the BARC block 2 receives the substrate W placed on the substrate rest part PASS4 by the transport robot TR2 of the resist coating block 3.

The substrate rest parts PASS3 and PASS4 extend through the partition 25. Each of the substrate rest parts PASS3 and PASS4 includes an optical sensor (not shown) for detecting the presence or absence of a substrate W thereon. Based on a detection signal from each of the sensors, a judgment is made as to whether or not the transport robots TR1 and TR2 stand ready to transfer and receive a substrate W to and from the substrate rest parts PASS3 and PASS4. A pair of (upper and lower) cool plates WCP of a water-cooled type for roughly cooling a substrate W are provided under the substrate rest parts PASS3 and PASS4 to extend through the partition 25.

The resist coating block 3 is a processing block for applying a resist onto a substrate W coated with the anti-reflective film by the BARC block 2 to form a resist film. In this preferred embodiment, a chemically amplified resist is used as the photoresist. The resist coating block 3 comprises a resist coating processor SC for forming the resist film by coating on the anti-reflective film serving as the undercoating film, a pair of thermal processing towers 31 for performing a thermal process which accompanies the resist coating process, and the transport robot TR2 for transferring and receiving a substrate W to and from the resist coating processor SC and the pair of thermal processing towers 31.

In the resist coating block 3, the resist coating processor SC and the pair of thermal processing towers 31 are arranged on opposite sides of the transport robot TR2. Specifically, the resist coating processor SC is on the front side of the substrate processing apparatus, and the pair of thermal processing towers 31 are on the rear side thereof. Additionally, a thermal barrier not shown is provided on the front side of the pair of thermal processing towers 31. Thus, the thermal effect of the pair of thermal processing towers 31 upon the resist coating processor SC is avoided by spacing the resist coating processor SC apart from the pair of thermal processing towers 31 and by providing the thermal barrier.

As shown in FIG. 2, the resist coating processor SC includes three coating processing units SC1, SC2 and SC3 similar in construction to each other and arranged in stacked relation in bottom-to-top order. The three coating processing units SC1, SC2 and SC3 are collectively referred to as the resist coating processor SC, unless otherwise identified. Each of the coating processing units SC1, SC2 and SC3 includes a spin chuck 32 for rotating a substrate W in a substantially horizontal plane while holding the substrate W in a substantially horizontal position under suction, a coating nozzle 33 for applying a resist solution onto the substrate W held on the spin chuck 32, a spin motor (not shown) for rotatably driving the spin chuck 32, a cup (not shown) surrounding the substrate W held on the spin chuck 32, and the like.

As shown in FIG. 3, one of the thermal processing towers 31 which is closer to the indexer block 1 includes six heating parts PHP1 to PHP6 arranged in stacked relation in bottom-to-top order for heating a substrate W up to a predetermined temperature. The other of the thermal processing towers 31 which is farther from the indexer block 1 includes cool plates CP4 to CP9 arranged in stacked relation in bottom-to-top order for cooling a heated substrate W down to a predetermined temperature and maintaining the substrate W at the predetermined temperature.

Each of the heating parts PHP1 to PHP6 is a thermal processing unit including, in addition to an ordinary hot plate for heating a substrate W placed thereon, a temporary substrate rest part for placing a substrate W in an upper position spaced apart from the hot plate, and a local transport mechanism 34 (see FIG. 1) for transporting a substrate W between the hot plate and the temporary substrate rest part. The local transport mechanism 34 is capable of moving vertically and moving back and forth, and includes a mechanism for cooling down a substrate W being transported by circulating cooling water therein.

The local transport mechanism 34 is provided on the opposite side of the above-mentioned hot plate and the temporary substrate rest part from the transport robot TR2, that is, on the rear side of the substrate processing apparatus. The temporary substrate rest part has both an open side facing the transport robot TR2 side and an open side facing the local transport mechanism 34. The hot plate, on the other hand, has only an open side facing the local transport mechanism 34, and a closed side facing the transport robot TR2. Thus, both of the transport robot TR2 and the local transport mechanism 34 can gain access to the temporary substrate rest part, but only the local transport mechanism 34 can gain access to the hot plate.

A substrate W is transported into each of the above-mentioned heating parts PHP1 to PHP6 in a manner to be described below. First, the transport robot TR2 places a substrate W onto the temporary substrate rest part. Subsequently, the local transport mechanism 34 receives the substrate W from the temporary substrate rest part to transport the substrate W to the hot plate. The hot plate performs a heating process on the substrate W. The local transport mechanism 34 takes out the substrate W subjected to the heating process by the hot plate, and transports the substrate W to the temporary substrate rest part. During the transport, the substrate W is cooled down by the cooling function of the local transport mechanism 34. Thereafter, the transport robot TR2 takes out the substrate W subjected to the heating process and transported to the temporary substrate rest part.

As discussed above, the transport robot TR2 transfers and receives the substrate W to and from only the temporary substrate rest part held at room temperature in each of the heating parts PHP1 to PHP6, but does not transfer and receive the substrate W to and from the hot plate. This avoids the temperature rise of the transport robot TR2. The hot plate having only the open side facing the local transport mechanism 34 prevents the heat atmosphere leaking out of the hot plate from affecting the transport robot TR2 and the resist coating processor SC. The transport robot TR2 transfers and receives a substrate W directly to and from the cool plates CP4 to CP9.

The transport robot TR2 is precisely identical in construction with the transport robot TR1. Thus, the transport robot TR2 is capable of causing each of a pair of holding arms thereof to independently gain access to the substrate rest parts PASS3 and PASS4, the thermal processing units provided in the thermal processing towers 31, the coating processing units provided in the resist coating processor SC, and the substrate rest parts PASS5 and PASS6 to be described later, thereby transferring and receiving substrates W to and from the above-mentioned parts and units.

Next, the development processing block 4 will be described. The development processing block 4 is provided so as to be sandwiched between the resist coating block 3 and the interface block 5. A partition 35 for closing off the communication of atmosphere is also provided between the resist coating block 3 and the development processing block 4. The partition 35 is provided with the pair of vertically arranged substrate rest parts PASS5 and PASS6 each for placing a substrate W thereon for the transfer of a substrate W between the resist coating block 3 and the development processing block 4. The substrate rest parts PASS5 and PASS6 are similar in construction to the above-mentioned substrate rest parts PASS1 and PASS2.

The upper substrate rest part PASS5 is used for the transport of a substrate W from the resist coating block 3 to the development processing block 4. Specifically, a transport robot TR3 of the development processing block 4 receives the substrate W placed on the substrate rest part PASS5 by the transport robot TR2 of the resist coating block 3. The lower substrate rest part PASS6, on the other hand, is used for the transport of a substrate W from the development processing block 4 to the resist coating block 3. Specifically, the transport robot TR2 of the resist coating block 3 receives the substrate W placed on the substrate rest part PASS6 by the transport robot TR3 of the development processing block 4.

The substrate rest parts PASS5 and PASS6 extend through the partition 35. Each of the substrate rest parts PASS5 and PASS6 includes an optical sensor (not shown) for detecting the presence or absence of a substrate W thereon. Based on a detection signal from each of the sensors, a judgment is made as to whether or not the transport robots TR2 and TR3 stand ready to transfer and receive a substrate W to and from the substrate rest parts PASS5 and PASS6. A pair of (upper and lower) cool plates WCP of a water-cooled type for roughly cooling a substrate W are provided under the substrate rest parts PASS5 and PASS6 to extend through the partition 35.

The development processing block 4 is a processing block for performing a development process on an exposed substrate W. The development processing block 4 comprises a development processor SD for applying a developing solution onto a substrate W exposed in a pattern to perform the development process, a pair of thermal processing towers 41 and 42 for performing a thermal process which accompanies the development process, and the transport robot TR3 for transferring and receiving a substrate W to and from the development processor SD and the pair of thermal processing towers 41 and 42. The transport robot TR3 is precisely identical in construction to the above-mentioned transport robots TR1 and TR2.

As shown in FIG. 2, the development processor SD includes five development processing units SD1, SD2, SD3, SD4 and SD5 similar in construction to each other and arranged in stacked relation in bottom-to-top order. The five development processing units SD1 to SD5 are collectively referred to as the development processor SD, unless otherwise identified. Each of the development processing units SD1 to SD5 includes a spin chuck 43 for rotating a substrate W in a substantially horizontal plane while holding the substrate W in a substantially horizontal position under suction, a nozzle 44 for applying the developing solution onto the substrate W held on the spin chuck 43, a spin motor (not shown) for rotatably driving the spin chuck 43, a cup (not shown) surrounding the substrate W held on the spin chuck 43, and the like.

As shown in FIG. 3, the thermal processing tower 41 which is closer to the indexer block 1 includes five hot plates HP7 to HP11 for heating a substrate W up to a predetermined temperature, and cool plates CP10 to CP12 for cooling a heated substrate W down to a predetermined temperature and maintaining the substrate W at the predetermined temperature. The cool plates CP10 to CP12 and the hot plates HP7 to HP11 are arranged in stacked relation in bottom-to-top order in this thermal processing tower 41. The thermal processing tower 42 which is farther from the indexer block 1, on the other hand, includes six heating parts PHP7 to PHP12 and a cool plate CP13 which are arranged in stacked relation. Like the above-mentioned heating parts PHP1 to PHP6, each of the heating parts PHP7 to PHP12 is a thermal processing unit including a temporary substrate rest part and a local transport mechanism. However, the temporary substrate rest part of each of the heating parts PHP7 to PHP12 has an open side facing a transport robot TR4 of the interface block 5, and a closed side facing the transport robot TR3 of the development processing block 4. In other words, the transport robot TR4 of the interface block 5 can gain access to the heating parts PHP7 to PHP12, but the transport robot TR3 of the development processing block 4 cannot gain access thereto. The transport robot TR3 of the development processing block 4 gains access to the thermal processing units incorporated in the thermal processing tower 41.

The pair of vertically arranged substrate rest parts PASS7 and PASS8 in proximity to each other for the transfer of a substrate W between the development processing block 4 and the interface block 5 adjacent thereto are incorporated in the thermal processing tower 42. The upper substrate rest part PASS7 is used for the transport of a substrate W from the development processing block 4 to the interface block 5. Specifically, the transport robot TR4 of the interface block 5 receives the substrate W placed on the substrate rest part PASS7 by the transport robot TR3 of the development processing block 4. The lower substrate rest part PASS8, on the other hand, is used for the transport of a substrate W from the interface block 5 to the development processing block 4. Specifically, the transport robot TR3 of the development processing block 4 receives the substrate W placed on the substrate rest part PASS8 by the transport robot TR4 of the interface block 5. Each of the substrate rest parts PASS7 and PASS8 includes both an open side facing the transport robot TR3 of the development processing block 4 and an open side facing the transport robot TR4 of the interface block 5.

Next, the interface block 5 will be described. The interface block 5 is a block provided adjacent to the development processing block 4. The interface block 5 receives a substrate W with the resist film formed thereon by the resist coating process from the resist coating block 3 to transfer the substrate W to the exposure apparatus EXP which is an external apparatus separate from the substrate processing apparatus according to the present invention. Also, the interface block 5 receives an exposed substrate W from the exposure apparatus EXP to transfer the exposed substrate W to the development processing block 4. The interface block 5 in this preferred embodiment comprises a transport mechanism 55 for transferring and receiving a substrate W to and from the exposure apparatus EXP, a pair of edge exposure parts EEW for exposing the periphery of a substrate W formed with the resist film, and the transport robot TR4 for transferring and receiving a substrate W to and from the heating parts PHP7 to PHP12 and cool plate CP13 provided in the development processing block 4 and the edge exposure parts EEW.

As shown in FIG. 2, each of the edge exposure parts EEW includes a spin chuck 56 for rotating a substrate W in a substantially horizontal plane while holding the substrate W in a substantially horizontal position under suction, a light irradiator 57 for exposing the periphery of the substrate W held on the spin chuck 56 to light, and the like. The pair of edge exposure parts EEW are arranged in vertically stacked relation in the center of the interface block 5. The transport robot TR4 provided adjacent to the edge exposure parts EEW and the thermal processing tower 42 of the development processing block 4 is similar in construction to the above-mentioned transport robots TR1 to TR3.

As illustrated also in FIG. 2, a return buffer RBF for the return of substrates W is provided under the pair of edge exposure parts EEW, and the pair of vertically arranged substrate rest parts PASS9 and PASS10 are provided under the return buffer RBF. The return buffer RBF is provided to temporarily store a substrate W subjected to a post-exposure heating process in the heating parts PHP7 to PHP12 of the development processing block 4 if the development processing block 4 is unable to perform the development process on the substrate W because of some sort of malfunction and the like. The return buffer RBF includes a cabinet capable of storing a plurality of substrates W in tiers. The upper substrate rest part PASS9 is used for the transfer of a substrate W from the transport robot TR4 to the transport mechanism 55. The lower substrate rest part PASS10 is used for the transfer of a substrate W from the transport mechanism 55 to the transport robot TR4. The transport robot TR4 gains access to the return buffer RBF.

The transport mechanism 55 includes a movable base 55a movable horizontally in the Y direction, and a holding arm 55b mounted on the movable base 55a and for holding a substrate W, as illustrated in FIG. 2. The holding arm 55b is capable of moving vertically, pivoting and moving back and forth in the direction of the pivot radius relative to the movable base 55a. With such an arrangement, the transport mechanism 55 transfers and receives a substrate W to and from the exposure apparatus EXP, transfers and receives a substrate W to and from the substrate rest parts PASS9 and PASS10, and stores and takes a substrate W into and out of a send buffer SBF for the sending of substrates W. The send buffer SBF is provided to temporarily store a substrate W prior to the exposure process if the exposure apparatus EXP is unable to accept the substrate W, and includes a cabinet capable of storing a plurality of substrates W in tiers.

A downflow of clean air is always supplied into the indexer block 1, the BARC block 2, the resist coating block 3, the development processing block 4, and the interface block 5 described above to thereby avoid the adverse effects of raised particles and gas flows upon the processes in the respective blocks 1 to 5. Additionally, a slightly positive pressure relative to the external environment of the substrate processing apparatus is maintained in each of the blocks 1 to 5 to prevent the entry of particles and contaminants from the external environment into the blocks 1 to 5.

The indexer block 1, the BARC block 2, the resist coating block 3, the development processing block 4 and the interface block 5 as described above are units into which the substrate processing apparatus of this preferred embodiment is divided in mechanical terms. The blocks 1 to 5 are assembled to individual block frames, respectively, which are in turn connected together to construct the substrate processing apparatus.

On the other hand, this preferred embodiment employs another type of units, that is, transport control units regarding the transport of substrates, aside from the blocks which are units based on the above-mentioned mechanical division. The transport control units regarding the transport of substrates are referred to herein as "cells." Each of the cells comprises a plurality of processing parts each for performing a predetermined process on a substrate, and a transport robot for circulatingly transporting a substrate to the plurality of processing parts. Each of the substrate rest parts PASS1 to PASS10 functions as an entrance substrate rest part for the receipt of a substrate W into a cell or as an exit substrate rest part for the transfer of a substrate W out of a cell. The transfer of substrates W between the cells is carried out through the substrate rest parts. The "processing parts" used herein shall include not only the thermal processing units, the coating processing units and the development processing units but also the substrate rest parts for merely placing a substrate W thereon because each of the substrate rest parts is a destination to which substrates W are transported. The "transport robot" used herein shall include the substrate transfer mechanism 12 and the transport mechanism 55.

The substrate processing apparatus in this preferred embodiment comprises six cells: an indexer cell, a BARC cell, a resist coating cell, a development processing cell, a post-exposure bake cell, and an interface cell. The indexer cell includes the table 11 and the substrate transfer mechanism 12, and is consequently similar in construction to the indexer block 1 which is one of the units based on the mechanical division. The BARC cell includes the bottom coating processor BRC, the pair of thermal processing towers 21 and the transport robot TR1. The BARC cell is also consequently similar in construction to the BARC block 2 which is one of the units based on the mechanical division. The resist coating cell includes the resist coating processor SC, the pair of thermal processing towers 31, and the transport robot TR2. The resist coating cell is also consequently similar in construction to the resist coating block 3 which is one of the units based on the mechanical division.

The development processing cell includes the development processor SD, the thermal processing tower 41, and the transport robot TR3. Because the transport robot TR3 cannot gain access to the heating parts PHP7 to PHP12 of the thermal processing tower 42 as discussed above, the development processing cell does not include the thermal processing tower 42. In this respect, the development processing cell differs from the development processing block 4 which is one of the units based on the mechanical division.

The post-exposure bake cell includes the thermal processing tower 42 positioned in the development processing block 4, the edge exposure parts EEW positioned in the interface block 5, and the transport robot TR4 positioned in the interface block 5. That is, the post-exposure bake cell extends over the development processing block 4 and the interface block 5 which are units based on the mechanical division. In this manner, constituting one cell including the heating parts PHP7 to PHP12 for performing the post-exposure heating process and the transport robot TR4 allows the rapid transport of exposed substrates W into the heating parts PHP7 to PHP12 for the execution of the thermal process. Such an arrangement is preferred for the use of a chemically amplified resist which is required to be subjected to a heating process as soon as possible after the exposure of a substrate W in a pattern.

The substrate rest parts PASS7 and PASS8 included in the thermal processing tower 42 are provided for the transfer of a substrate W between the transport robot TR3 of the development processing cell and the transport robot TR4 of the post-exposure bake cell.

The interface cell includes the transport mechanism 55 for transferring and receiving a substrate W to and from the exposure apparatus EXP which is an external apparatus. The interface cell differs from the interface block 5 which is one of the units based on the mechanical division in that the interface cell does not include the transport robot TR4 and the edge exposure parts EEW. The substrate rest parts PASS9 and PASS10 under the edge exposure parts EEW are provided for the transfer of a substrate W between the transport robot TR4 of the post-exposure bake cell and the transport mechanism 55 of the interface cell.

Figure 6:
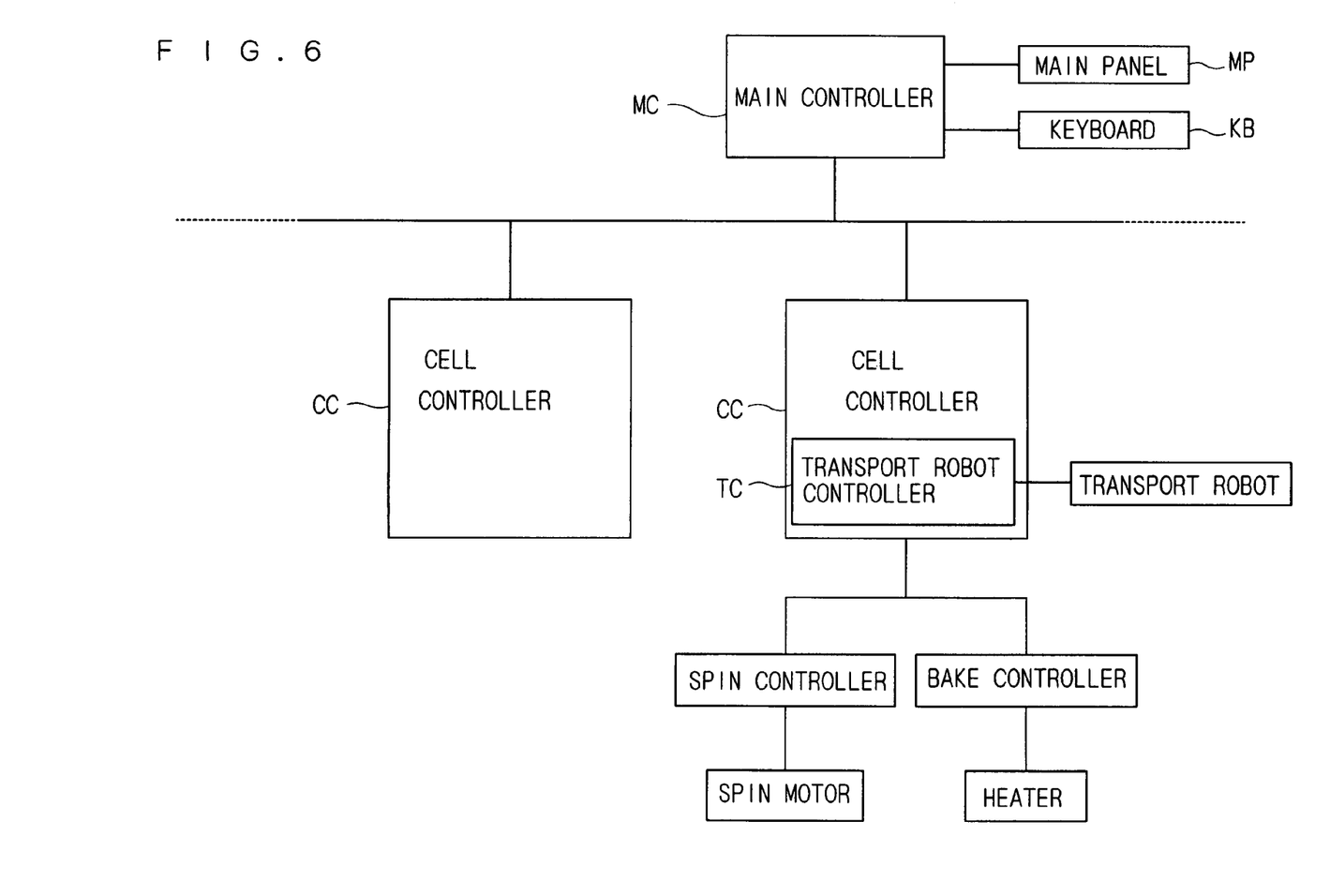
FIG. 6 is a block diagram schematically showing a control mechanism in the substrate processing apparatus of FIG. 1.

A control mechanism in the substrate processing apparatus of this preferred embodiment will be described. FIG. 6 is a schematic block diagram of the control mechanism. As shown in FIG. 6, the substrate processing apparatus of this preferred embodiment has a three-level control hierarchy composed of a main controller MC, cell controllers CC, and unit controllers. The main controller MC, the cell controllers CC and the unit controllers are similar in hardware construction to typical computers. Specifically, each of the controllers comprises a CPU for performing various computation processes, a ROM or read-only memory for storing a basic program therein, a RAM or readable/writable memory for storing various pieces of information therein, a magnetic disk for storing control applications and data therein, and the like.

The single main controller MC at the first level is provided for the entire substrate processing apparatus, and is principally responsible for the management of the entire substrate processing apparatus, the management of a main panel MP, and the management of the cell controllers CC. The main panel MP functions as a display for the main controller MC. Various commands may be entered into the main controller MC from a keyboard KB. The main panel MP may be in the form of a touch panel so that a user performs an input process into the main controller MC from the main panel MP.

The cell controllers CC at the second level are individually provided in corresponding relation to the six cells (the indexer cell, the BARC cell, the resist coating cell, the development processing cell, the post-exposure bake cell, and the interface cell). Each of the cell controllers CC is principally responsible for the control of the transport of substrates and the management of the units in a corresponding cell. Specifically, the cell controllers CC for the respective cells send and receive information in such a manner that a first cell controller CC for a first cell sends information indicating that a substrate W is placed on a predetermined substrate rest part to a second cell controller CC for a second cell adjacent to the first cell, and the second cell controller CC for the second cell having received the substrate W sends information indicating that the substrate W is received from the predetermined substrate rest part back to the first cell controller CC. Such sending and receipt of information are carried out through the main controller MC. Each of the cell controllers CC provides the information indicating that a substrate W is transported into a corresponding cell to a transport robot controller TC, which in turn controls a corresponding transport robot to circulatingly transport the substrate W in the corresponding cell in accordance with a predetermined procedure (or flow recipe). The transport robot controller TC is a controller implemented by the operation of a predetermined application in the corresponding cell controller CC.

Examples of the unit controllers at the third level include a spin controller and a bake controller. The spin controller directly controls spin units (the coating processing units and the development processing units) provided in a corresponding cell in accordance with an instruction given from a corresponding cell controller CC. Specifically, the spin controller controls, for example, a spin motor for a spin unit to adjust the number of revolutions of a substrate W. The bake controller directly controls the thermal processing units (the hot plates, the cool plates, the heating parts, and the like) provided in a corresponding cell in accordance with an instruction given from a corresponding cell controller CC. Specifically, the bake controller controls, for example, a heater incorporated in a hot plate to adjust a plate temperature and the like.

The host computer 100 connected via the LAN lines to the substrate processing apparatus ranks as a higher level control mechanism than the three-level control hierarchy provided in the substrate processing apparatus (see FIG. 1). The host computer 100 comprises a CPU for performing various computation processes, a ROM or read-only memory for storing a basic program therein, a RAM or readable/writable memory for storing various pieces of information therein, a magnetic disk for storing control applications and data therein, and the like. The host computer 100 is similar in construction to a typical computer. Typically, a plurality of substrate processing apparatuses according to this preferred embodiment are connected to the host computer 100. The host computer 100 provides a flow recipe containing descriptions about a processing procedure and processing conditions to each of the substrate processing apparatuses.

The exposure apparatus EXP is provided with a separate controller independent of the above-mentioned control mechanism of the substrate processing apparatus. In other words, the exposure apparatus EXP does not operate under the control of the main controller MC of the substrate processing apparatus, but controls its own operation alone. Such an exposure apparatus EXP also controls its own operation in accordance with a recipe received from the host computer 100, and the substrate processing apparatus performs processes synchronized with the exposure process in the exposure apparatus EXP.

The operation of the substrate processing apparatus of this preferred embodiment will be described. First, brief description will be given on a general procedure for the circulating transport of substrates W in the entire substrate processing apparatus. First, unprocessed substrates W stored in a cassette C are transported from the outside of the substrate processing apparatus into the indexer block 1 by an AGV (automatic guided vehicle) and the like. Subsequently, the unprocessed substrates W are transferred outwardly from the indexer block 1. Specifically, the substrate transfer mechanism 12 in the indexer cell (or the indexer block 1) takes an unprocessed substrate W out of a predetermined cassette C, and places the unprocessed substrate W onto the substrate rest part PASS1. When the unprocessed substrate W is placed on the substrate rest part PASS1, the transport robot TR1 of the BARC cell uses one of the holding arms 6a and 6b to receive the unprocessed substrate W. The transport robot TR1 transports the received unprocessed substrate W to one of the coating processing units BRC1 to BRC3. In the coating processing units BRC1 to BRC3, the substrate W is spin-coated with the coating solution for the anti-reflective film.

After the completion of the coating process, the transport robot TR1 transports the substrate W to one of the hot plates HP1 to HP6. Heating the substrate W in the hot plate dries the coating solution to form the anti-reflective film serving as the undercoat on the substrate W. Thereafter, the transport robot TR1 takes the substrate W from the hot plate, and transports the substrate W to one of the cool plates CP1 to CP3, which in turn cools down the substrate W. In this step, the cool plate WCP may be used to cool down the substrate W. The transport robot TR1 places the cooled substrate W onto the substrate rest part PASS3.

Alternatively, the transport robot TR1 may be adapted to transport the unprocessed substrate W placed on the substrate rest part PASS1 to one of the adhesion promotion processing units AHL1 to AHL3. In the adhesion promotion processing units AHL1 to AHL3, the substrate W is thermally processed in a vapor atmosphere of HMDS, whereby the adhesion of the resist film to the substrate W is promoted. The transport robot TR1 takes out the substrate W subjected to the adhesion promotion process, and transports the substrate W to one of the cool plates CP1 to CP3, which in turn cools down the substrate W. Because the anti-reflective film is not to be formed on the substrate W subjected to the adhesion promotion process, the cooled substrate W is directly placed onto the substrate rest part PASS3 by the transport robot TR1.

A dehydration process may be performed prior to the application of the coating solution for the anti-reflective film. In this case, the transport robot TR1 transports the unprocessed substrate W placed on the substrate rest part PASS1 first to one of the adhesion promotion processing units AHL1 to AHL3. In the adhesion promotion processing units AHL1 to AHL3, a heating process (dehydration bake) merely for dehydration is performed on the substrate W without supplying the vapor atmosphere of HMDS. The transport robot TR1 takes out the substrate W subjected to the heating process for dehydration, and transports the substrate W to one of the cool plates CP1 to CP3, which in turn cools down the substrate W. The transport robot TR1 transports the cooled substrate W to one of the coating processing units BRC1 to BRC3. In the coating processing units BRC1 to BRC3, the substrate W is spin-coated with the coating solution for the anti-reflective film. Thereafter, the transport robot TR1 transports the substrate W to one of the hot plates HP1 to HP6. Heating the substrate W in the hot plate forms the anti-reflective film serving as the undercoat on the substrate W. Thereafter, the transport robot TR1 takes the substrate W from the hot plate, and transports the substrate W to one of the cool plates CP1 to CP3, which in turn cools down the substrate W. Then, the transport robot TR1 places the cooled substrate W onto the substrate rest part PASS3.

When the substrate W is placed on the substrate rest part PASS3, the transport robot TR2 in the resist coating cell receives the substrate W, and transports the substrate W to one of the coating processing units SC1 to SC3. In the coating processing units SC1 to SC3, the substrate W is spin-coated with the resist. Because the resist coating process requires precise substrate temperature control, the substrate W may be transported to one of the cool plates CP4 to CP9 immediately before being transported to the coating processing units SC1 to SC3.

After the completion of the resist coating process, the transport robot TR2 transports the substrate W to one of the heating parts PHP1 to PHP6. In the heating parts PHP1 to PHP6, heating the substrate W removes a solvent component from the resist to form a resist film on the substrate W. Thereafter, the transport robot TR2 takes the substrate W from the one of the heating parts PHP1 to PHP6, and transports the substrate W to one of the cool plates CP4 to CP9, which in turn cools down the substrate W. Then, the transport robot TR2 places the cooled substrate W onto the substrate rest part PASS5.

When the substrate W with the resist film formed thereon by the resist coating process is placed on the substrate rest part PASS5, the transport robot TR3 in the development processing cell receives the substrate W, and places the substrate W onto the substrate rest part PASS7 without any processing of the substrate W. Then, the transport robot TR4 in the post-exposure bake cell receives the substrate W placed on the substrate rest part PASS7, and transports the substrate W to one of the edge exposure parts EEW. In the edge exposure parts EEW, a peripheral edge portion of the substrate W is exposed to light. The transport robot TR4 places the substrate W subjected to the edge exposure process onto the substrate rest part PASS9. The transport mechanism 55 in the interface cell receives the substrate W placed on the substrate rest part PASS9, and transports the substrate W into the exposure apparatus EXP. The substrate W transported into the exposure apparatus EXP is subjected to the pattern exposure process. Because the chemically amplified resist is used in this preferred embodiment, an acid is formed by a photochemical reaction in the exposed portion of the resist film formed on the substrate W.

The exposed substrate W subjected to the pattern exposure process is transported back to the interface cell again. The transport mechanism 55 places the exposed substrate W onto the substrate rest part PASS10. When the exposed substrate W is placed on the substrate rest part PASS10, the transport robot TR4 in the post-exposure bake cell receives the substrate W, and transports the substrate W to one of the heating parts PHP7 to PHP12. In the heating parts PHP7 to PHP12, the heating process (post-exposure bake) is performed which causes reactions such as crosslinking, polymerization and the like of the resist resin to proceed by using a product formed by the photochemical reaction during the exposure process as an acid catalyst, thereby locally changing the solubility of only the exposed portion of the resist resin in the developing solution. The transport robot TR4 takes out the substrate W subjected to the post-exposure bake process, and transports the substrate W to the cool plate CP13, which in turn cools down the substrate W. The transport robot TR4 places the cooled substrate W onto the substrate rest part PASS8.

When the substrate W is placed on the substrate rest part PASS8, the transport robot TR3 in the development processing cell receives the substrate W, and transports the substrate W to one of the development processing units SD1 to SD5. In the development processing units SD1 to SD5, the developing solution is applied onto the substrate W to cause the development process to proceed. After the completion of the development process, the transport robot TR3 transports the substrate W to one of the hot plates HP7 to HP11, and then to one of the cool plates CP10 to CP12.

Thereafter, the transport robot TR3 places the substrate W onto the substrate rest part PASS6. The transport robot TR2 in the resist coating cell transfers the substrate W from the substrate rest part PASS6 onto the substrate rest part PASS4 without any processing of the substrate W. Next, the transport robot TR1 in the BARC cell transfers the substrate W from the substrate rest part PASS4 onto the substrate rest part PASS2 without any processing of the substrate W. Then, the substrate transfer mechanism 12 in the indexer cell stores the processed substrate W held on the substrate rest part PASS2 into a predetermined cassette C. Thereafter, the cassette C in which a predetermined number of processed substrates W are stored is transported to the outside of the substrate processing apparatus. Thus, a series of steps in the photolithography process is completed.

In the substrate processing apparatus according to this preferred embodiment, the chemically amplified resist is applied as the photoresist to the substrate W. When the chemically amplified resist is used, a slight variation in processing conditions exerts a large influence upon line width uniformity, as described above. For this reason, processing conditions are made as constant as possible for all of the substrates W to be processed. In particular, the substrate processing apparatus according to this preferred embodiment is managed so as to provide a constant time interval between the instant of the end of the exposure process in the exposure apparatus EXP and the instant of the start of the post-exposure bake process in the heating parts PHP7 to PHP12, because this time interval exerts the greatest influence on the line width uniformity.

Additionally, the substrate processing apparatus according to this preferred embodiment is adapted to provide a constant time interval between the completion of the resist coating process of substrates W in the coating processing units SC1 to SC3 and the execution of the exposure process of the substrates W in the exposure apparatus EXP. Specifically, the cell controllers CC provided for the six respective cells control the processing parts in the respective cells so that substrates W are present in the respective cells for a constant length of time (referred to hereinafter as a "substrate presence time"), and cause the respective transport robot controllers TC to control the transport robots. The longest one of the substrate presence times for the six respective cells is selected as the substrate presence time of the substrate processing apparatus. For example, if time $T_1$ is the longest one of the substrate presence times for the six respective cells, the cell controllers CC control the processing parts and the transport robots in the respective cells so that the substrate presence times for all of the cells are equal to $T_1$. This allows the constant substrate presence time for all of the six cells, thereby to prevent the accumulation of substrates W in any one of the cells, and also allows the constant processing time for all of the substrates W to be processed. The result is the constant time interval between the completion of the resist coating process of substrates W in the coating processing units SC1 to SC3 and the execution of the exposure process of the substrates W in the exposure apparatus EXP.

If substrates W transported within the substrate processing apparatus are prevented from being accumulated, a difference between the time intervals at which substrates W subjected to the resist coating process are fed to the interface cell and the time intervals at which the exposure process is performed in the exposure apparatus EXP causes the accumulation of substrates W in the send buffer SBF in the interface cell. In such a condition, there arises a difference or variation between substrates W in the time interval between the completion of the resist coating process and the execution of the exposure process. To solve such a problem, this preferred embodiment makes the time intervals at which unprocessed substrates W are transferred outwardly from the indexer cell identical with the time intervals at which the exposure apparatus EXP executes the exposure process. Thus, at the same time that the exposure process of a substrate W is completed in the exposure apparatus EXP, a new resist-coated substrate W is transferred from the interface cell to the exposure apparatus EXP. This provides the constant time interval between the completion of the resist coating process of substrates W and the execution of the exposure process without the decrease in processing efficiency.

The time intervals at which the exposure apparatus EXP executes the exposure process are constant so long as the same pattern is printed. However, printing a different pattern involves the replacement of the current reticle with another, thereby to require time for replacement. Thus, transferring substrates W outwardly from the indexer cell at constant time intervals independently of the change of the exposure pattern gives rise to the presence of a substrate W which must wait in the send buffer SBF for the reticle replacement time, to result in variations in the time interval between the resist coating process and the exposure process. To prevent this, the substrate processing apparatus of this preferred embodiment carries out the outward transfer of substrates W from the indexer cell in accordance with a flow chart shown in FIG. 7.

Figure 7:
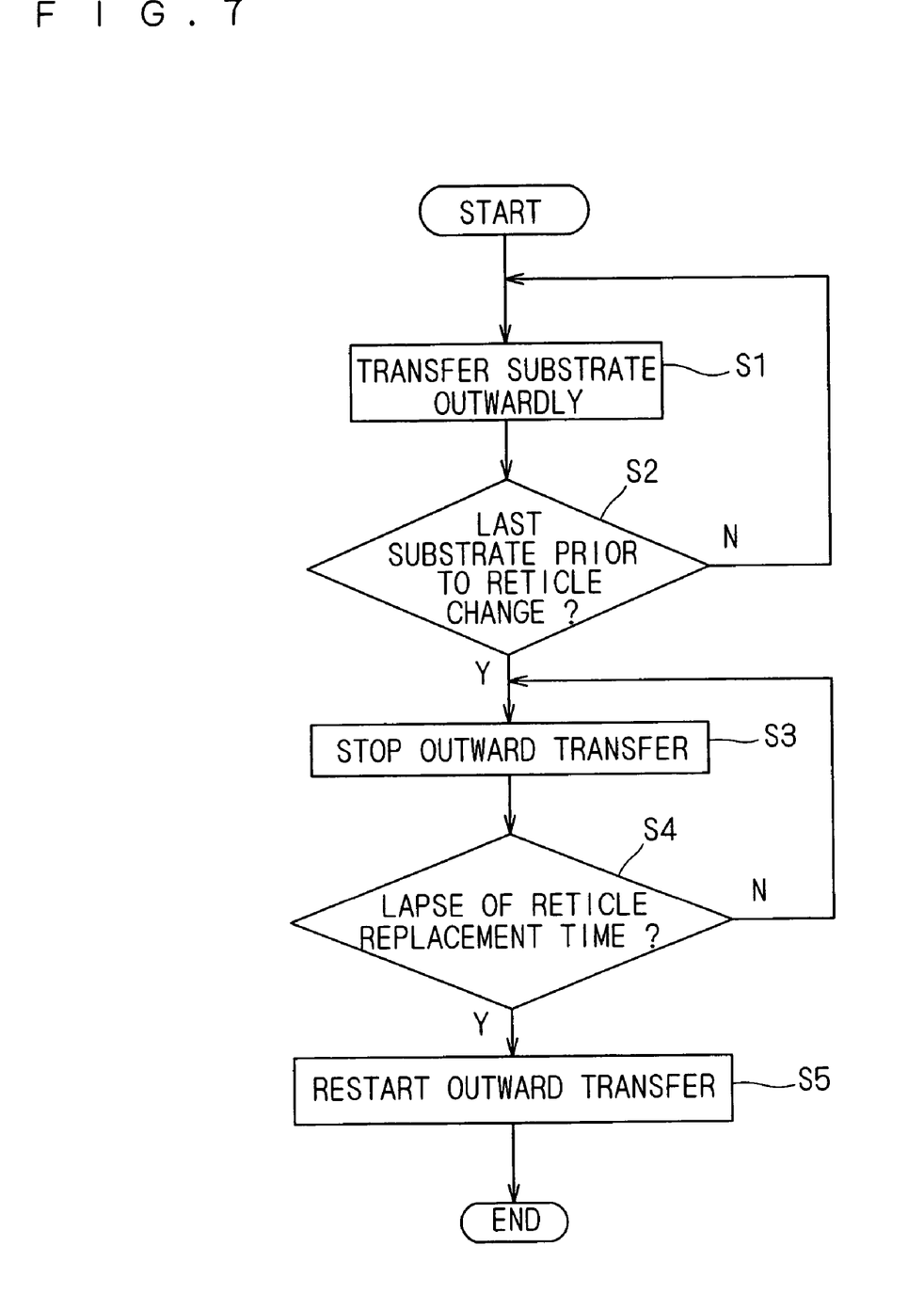
FIG. 7 is a flow chart showing a procedure for transferring a substrate outwardly from an indexer cell.

First, a substrate W (first substrate) is transferred outwardly from the indexer cell in Step S1. The main controller MC judges whether the substrate W is the last substrate prior to reticle change or not (in Step S2). The main controller MC makes this judgment by referencing a flow recipe provided from the host computer 100 regarding the first substrate W and a second substrate W to be processed next. The first substrate W is judged to be the last substrate prior to the reticle change when there is a difference in exposure pattern between the first substrate W and the second substrate W as a result of the reference to the flow recipe.

When the first substrate W is not the last substrate prior to the reticle change, that is, the reticle for use in the exposure process of the first substrate W and the reticle for use in the exposure process of the second substrate W are the same, the same pattern is to be printed on the first substrate W and on the second substrate W subsequent to the first substrate W without the reticle change. Therefore, the processing returns to Step S1 after the above-mentioned time interval for the exposure process in the exposure apparatus EXP, and the second substrate W is transferred outwardly from the indexer cell.

On the other hand, when the first substrate W is the last substrate prior to the reticle change, that is, the reticle for use in the exposure process of the first substrate W and the reticle for use in the exposure process of the second substrate W are different from each other, the reticle change is performed after the completion of the exposure process of the first substrate W in the exposure apparatus EXP. In this case, the processing proceeds to Step S3 in which the main controller MC provides an instruction to the cell controller CC for the indexer cell to temporarily stop the outward transfer of the second substrate W from the indexer cell. This is because the outward transfer of the second substrate W after the same time interval requires the second substrate W to wait in the send buffer SBF for a length of time corresponding to the reticle replacement time in the exposure apparatus EXP, resulting in a difference between the first substrate W and the second substrate W in the time interval between the resist coating process and the exposure process.

Next, the processing proceeds to Step S4 in which a standby condition continues for the length of time corresponding to the reticle replacement time in the exposure apparatus EXP while the outward transfer of the second substrate W is temporarily stopped. The reticle replacement time is previously stored as an initial parameter in the main controller MC. After a lapse of the time corresponding to the reticle replacement time, the processing proceeds to Step S5 in which the main controller MC cancels the temporary stop of the outward transfer, and cause the outward transfer of the second substrate W from the indexer cell. Such a procedure allows the transfer of the second substrate W from the interface cell to the exposure apparatus EXP at the instant when the reticle change in the exposure apparatus EXP is completed after the completion of the exposure process of the first substrate W, thereby causing no wasted time for the exposure apparatus EXP. Additionally, such a situation that the second substrate W must wait in the send buffer SBF and the like is avoided. In other words, this outward transfer procedure achieves the constant time interval between the completion of the resist coating process of substrates W and the execution of the exposure process thereof without the decrease in processing efficiency.

Thus, the constant time interval between the completion of the resist coating process of substrates W and the execution of the exposure process thereof provides a uniform processing history for all of the substrates W to be processed, thereby further improving the line width uniformity of a pattern when the chemically amplified resist is used.

Although the preferred embodiment according to the present invention has been described hereinabove, various modifications in addition to the above may be made without departing from the spirit and scope of the present invention. For example, the above-mentioned preferred embodiment provides the constant substrate presence time for all of the six cells, thereby to achieve the constant time interval between the completion of the resist coating process of substrates W in the coating processing units SC1 to SC3 and the execution of the exposure process thereof in the exposure apparatus EXP. The present invention, however, is not limited to this. So long as at least the time required for the steps between the coating process in the coating processing units SC1 to SC3 and the exposure process in the exposure apparatus EXP is controlled to be constant, it is not always necessary to make other steps identical with those described above.

The construction of the substrate processing apparatus according to the present invention is not limited to that shown in FIGS. 1 through 4. However, various modifications may be made to the construction of the substrate processing apparatus if a transport robot circulatingly transports a substrate W to a plurality of processing parts whereby predetermined processes are performed on the substrate W.

While the invention has been described in detail, the foregoing description is in all aspects illustrative and not restrictive. It is understood that numerous other modifications and variations can be devised without departing from the scope of the invention.

What is claimed is:

1. A substrate processing apparatus for transporting a substrate with a resist film formed thereon by coating the substrate with a resist into an exposure apparatus and for performing a development process on an exposed substrate received from the exposure apparatus, said substrate processing apparatus comprising:

a coating processing part for performing a resist coating process on a substrate;

a development processing part for performing a development process on an exposed substrate;

an interface part for receiving a substrate with a resist film formed thereon by said resist coating process from said coating processing part to transfer said substrate to an exposure apparatus, and for receiving an exposed substrate from said exposure apparatus to transfer said exposed substrate to said development processing part;

an indexer part for transferring an unprocessed substrate received from the outside of said substrate processing apparatus outwardly therefrom to said coating processing part, and for transporting a processed substrate received from said development processing part to the outside of said substrate processing apparatus;

a transport part for transporting a substrate between said coating processing part, said development processing part, said interface part and said indexer part; and a control part configured to control said transport part to provide a constant time interval between the completion of said resist coating process of substrates in said coating processing part and the execution of an exposure process of said substrates in said exposure apparatus.

2. The substrate processing apparatus according to claim 1, wherein when a reticle for use in the exposure process of a first substrate is different from a reticle for use in the exposure process of a second substrate to be processed subsequently to said first substrate, said indexer part transfers said second substrate outwardly therefrom at the instant when reticle replacement time in said exposure apparatus has elapsed since the outward transfer of said first substrate from said indexer part.

3. The substrate processing apparatus according to claim 2, further comprising a heating processing part for performing a heating process on an exposed substrate yet to be subjected to the development process, wherein said control part controls said transport part to provide a constant time interval between the completion of the exposure process of substrates in said exposure apparatus and the execution of the heating process of said substrates in said heating processing part.

* * * * *